(12) United States Patent
Yun et al.

(10) Patent No.: US 9,056,377 B2
(45) Date of Patent: Jun. 16, 2015

(54) ROUTER APPARATUS

(75) Inventors: Chan-Hyung Yun, Asan-si (KR);
Hyun-Jong Oh, Seoul (KR);
Seong-Chan Han, Cheonan-si (KR);
Hun Han, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 886 days.

(21) Appl. No.: 13/241,339

(22) Filed: Sep. 23, 2011

(65) Prior Publication Data

US 2012/0207561 A1 Aug. 16, 2012

(30) Foreign Application Priority Data

Feb. 14, 2011 (KR) ........................ 10-2011-0012849

(51) Int. Cl.
*B23C 3/00* (2006.01)
*B23C 1/08* (2006.01)
*B23Q 9/00* (2006.01)
*H05K 3/00* (2006.01)

(52) U.S. Cl.
CPC ............... *B23Q 9/0042* (2013.01); *B23C 3/00* (2013.01); *Y10T 409/307728* (2015.01); *Y10T 409/30924* (2015.01); *Y10T 409/308568* (2015.01); *B23C 1/08* (2013.01); *H05K 3/0052* (2013.01)

(58) Field of Classification Search
CPC ..................................... B23C 1/08; B23C 3/00
USPC ......... 409/108–110, 203, 121, 124, 126, 159, 409/190, 217, 228, 229; 144/371, 24, 144/24.19, 203, 204, 82, 85, 69, 74
See application file for complete search history.

(56) References Cited

U.S. PATENT DOCUMENTS

| | | | | |
|---|---|---|---|---|
| 2,670,018 A | * | 2/1954 | Edwin | 144/223 |
| 2,765,825 A | * | 10/1956 | Neilson | 144/83 |
| 2,771,104 A | * | 11/1956 | Saxe | 144/114.1 |
| 2,800,060 A | * | 7/1957 | Chapman | 409/110 |
| 3,295,417 A | * | 1/1967 | Hanlon | 409/122 |
| 4,030,402 A | * | 6/1977 | Onsrud | 409/229 |
| 4,212,570 A | * | 7/1980 | Larsson | 408/95 |
| 4,530,627 A | * | 7/1985 | Kosmowski | 409/80 |
| 5,062,750 A | * | 11/1991 | Oosterhof | 409/132 |
| 5,284,406 A | * | 2/1994 | Mueller et al. | 409/110 |
| 5,634,250 A | * | 6/1997 | Mihailovic | 29/26 A |
| 5,979,520 A | * | 11/1999 | Behrendt | 144/114.1 |
| 6,067,695 A | * | 5/2000 | Momoitio | 29/26 A |

(Continued)

FOREIGN PATENT DOCUMENTS

| | | | | | |
|---|---|---|---|---|---|
| GB | | 804489 A | * 11/1958 | ............. | B27C 1/007 |
| JP | | 05-050307 A | * 3/1993 | ............. | B23B 35/00 |

(Continued)

OTHER PUBLICATIONS

JP_2007245331_A_translation.*

*Primary Examiner* — Daniel Howell
*Assistant Examiner* — Ryan Rufo
(74) *Attorney, Agent, or Firm* — Sughrue Mion, PLLC

(57) ABSTRACT

A router apparatus is provided. The router apparatus includes a plurality of panels stacked vertically; a router bit which cuts the panels simultaneously; a first supporting unit connected to one end of the router bit, and a second supporting unit connected to the other end of the router bit. A guide rail is formed in the second supporting unit in order to guide a movement of the router bit.

11 Claims, 5 Drawing Sheets

(56) References Cited

U.S. PATENT DOCUMENTS

| | | | |
|---|---|---|---|
| 8,485,767 B2 * | 7/2013 | Chen | 409/234 |
| 2010/0119317 A1 * | 5/2010 | Kumagai et al. | 408/1 R |

FOREIGN PATENT DOCUMENTS

| | | | | | |
|---|---|---|---|---|---|
| JP | 09-172262 A | * | 6/1997 | | B23B 41/00 |
| JP | 11-235633 A | * | 8/1999 | | B23Q 3/12 |
| JP | 2002-280747 A | | 9/2002 | | |
| JP | 2004-314209 A | | 11/2004 | | |
| JP | 2005-328084 A | | 11/2005 | | |
| JP | 2007-245331 A | * | 9/2007 | | B23B 39/24 |
| JP | 2010-260164 A | * | 11/2010 | | B23C 5/10 |
| KR | 10-2007-0117285 A | | 12/2007 | | |

* cited by examiner

ROUTER APPARATUS

CROSS-REFERENCE TO RELATED APPLICATION

This application claims priority from Korean Patent Application No. 10-2011-0012849 filed on Feb. 14, 2011 in the Korean Intellectual Property Office, and all the benefits accruing therefrom under 35 U.S.C. 119, the contents of which in its entirety are herein incorporated by reference.

BACKGROUND

1. Field

The present inventive concept relates to a router apparatus, and more particularly to a router apparatus in which a guide rail is formed to moving a router bit or a plurality of panels.

2. Description of the Related Art

In general, a plurality of printed circuit boards are fixed to one panel in order to simplify of the printed circuit boards and to quickly perform an automated process. After a process comprising several steps, a routing process is performed in order to separate an individual printed circuit board from a panel to which a plurality of printed circuit boards are fixed.

Methods for separating printed circuit boards from a panel may include, e.g., a shearing method, a routing method, a break-away method of routed tabs, a scoring method, a perforation method, various punching methods, die technology, etc.

In the situation of using a routing method, a plurality of panels may be stacked and cut at the same time in order to improve productivity.

However, in a situation where a cutting process is performed on the stacked panels by using a router apparatus, an area and length of the printed circuit boards in contact with a router bit may increase. Since the router bit is not stably fixed during the cutting process, there exists a problem of reduced cutting accuracy.

SUMMARY

The present inventive concept provides a router apparatus capable of improving cutting accuracy.

The objects of the present inventive concept are not limited thereto, and other objects of the present inventive concept will be described in or be apparent from the following description of the exemplary embodiments.

According to an aspect of the present inventive concept, there is provided a router apparatus including a plurality of panels stacked vertically, a router bit which simultaneously cuts the panels, a first supporting unit connected to one end of the router bit, and a second supporting unit connected to the other end of the router bit, wherein a guide rail is formed in the second supporting unit in order to guide movement of the router bit.

According to another aspect of the present inventive concept, there is provided a router apparatus including a plurality of panels stacked vertically, first and second frames which support the panels at opposite sides, a body on which the first and second frames are arranged, and a router bit disposed on the body to simultaneously cut the panels, wherein the first and second frames move in a first direction, and the router bit passes through the panels to simultaneously cut the panels.

According to another aspect of the present inventive concept, there is provided a router apparatus including a plurality of vertically stacked panels, a router bit which simultaneously cuts the panels, a supporting unit connected to an end of the router bit and a guide rail formed in the supporting unit to guide a movement of the router bit.

Other aspects of the present inventive concept are included in the detailed description and drawings.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EXEMPLARY EMBODIMENTS

Figure 1:
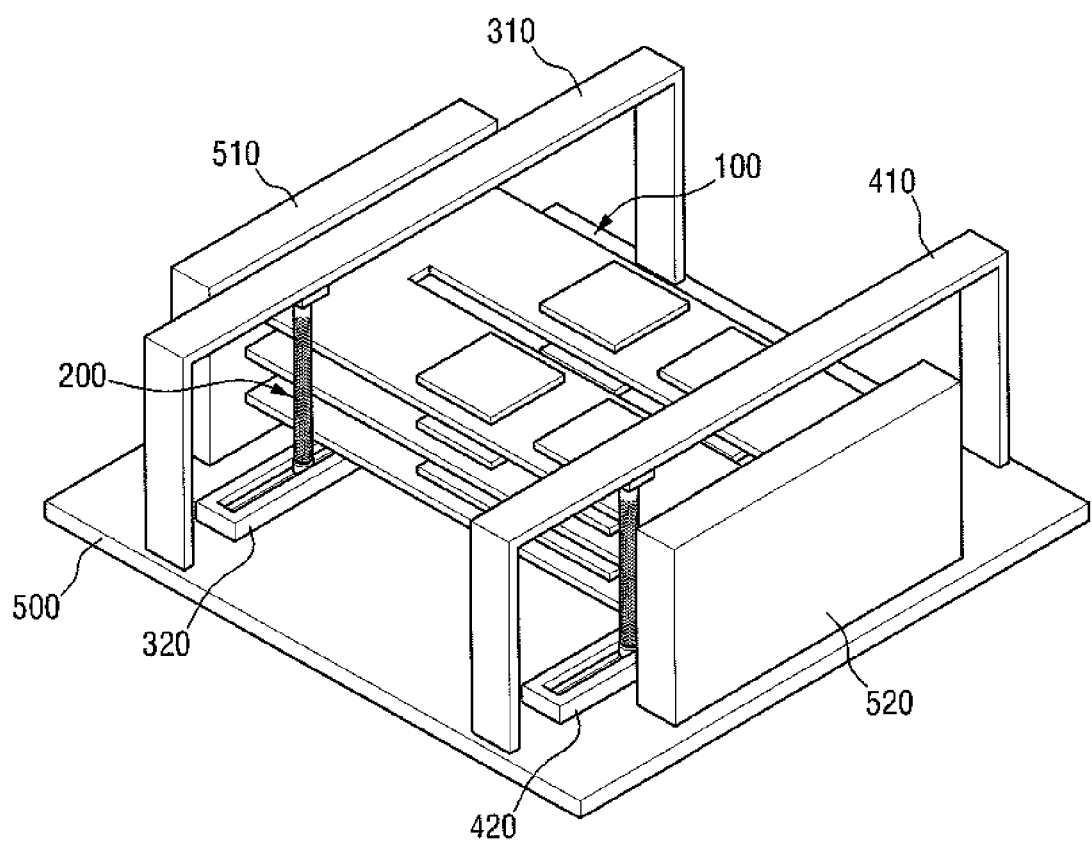
FIG. 1 is a perspective view for explaining a router apparatus in accordance with an exemplary embodiment.

Advantages and features of the present inventive concept and methods of accomplishing the same may be understood more readily by reference to the following detailed description of exemplary embodiments and the accompanying drawings. The present inventive concept may, however, be embodied in many different forms and should not be construed as being limited to the exemplary embodiments set forth herein. Rather, these exemplary embodiments are provided so that this disclosure will be thorough and complete and will fully convey the concept of the inventive concept to those skilled in the art, and the present invention will only be defined by the appended claims. In the drawings, sizes and relative sizes of layers and regions may be exaggerated for clarity.

Like numbers refer to like elements throughout. As used herein, the term "and/or" includes any and all combinations of one or more of the associated listed items.

The terminology used herein is only for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Exemplary embodiments are described herein with reference to plan and cross-section illustrations that are schematic illustrations of idealized embodiments of the inventive concept. As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing.

Unless specially defined, all terms (including technical and scientific terms) used in the description could be construed to have as meanings commonly understood by those ordinary skilled in the art to which the present inventive concept belongs. In addition, terms that are generally used but are not defined in the dictionary are not interpreted ideally or excessively unless they have been clearly and specially defined.

Figure 2:
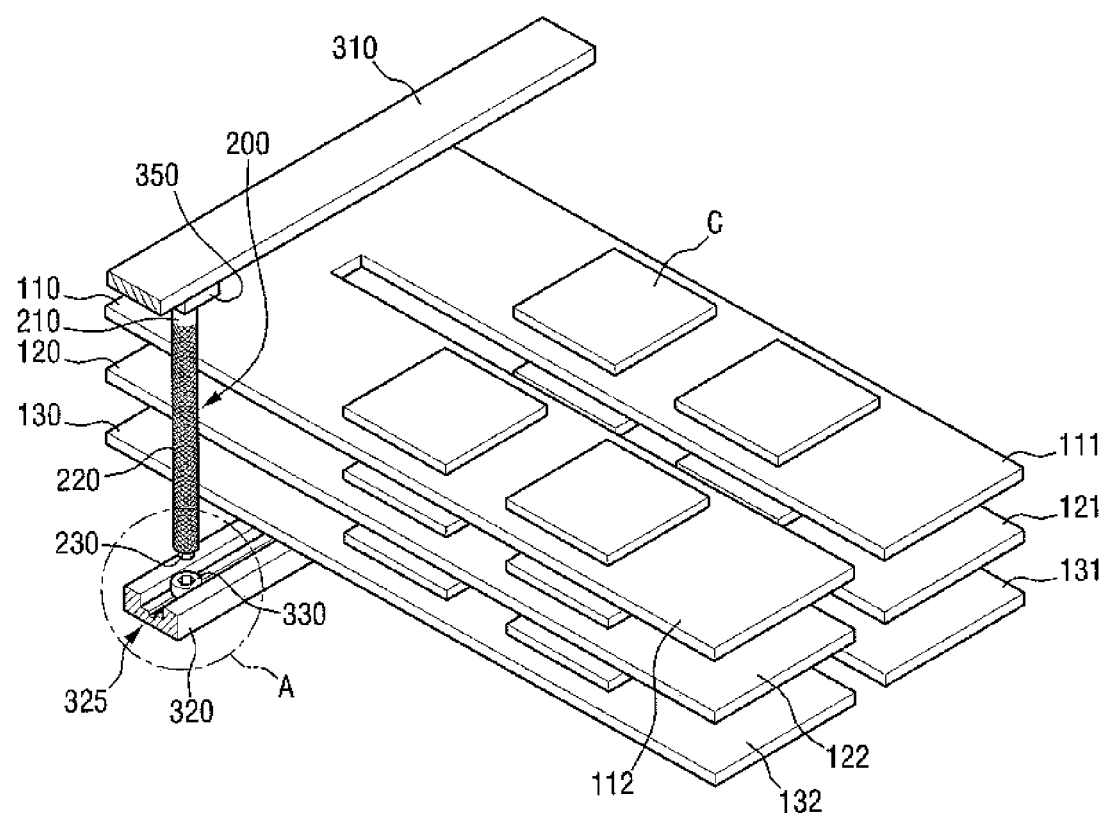
FIG. 2 illustrates a partial perspective view for explaining a plurality of panels and a router bit of the router apparatus in accordance with an exemplary embodiment.
Figure 3:
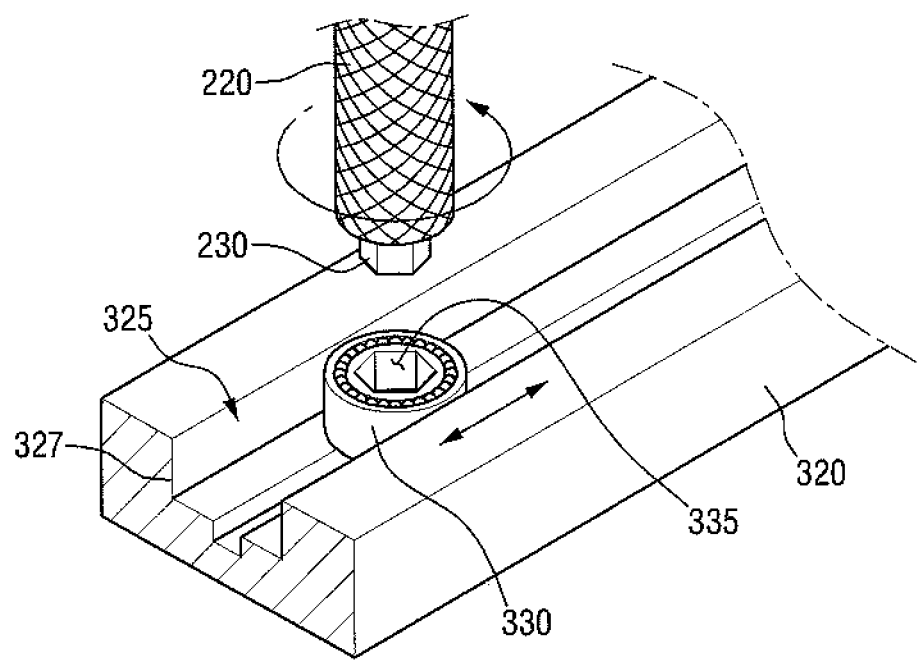
FIG. 3 is a partial enlarged perspective view showing a region A of FIG. 2.

Hereinafter, a router apparatus in accordance with exemplary embodiments will be described with reference to FIGS. 1 to 3. FIG. 1 is a perspective view for explaining a router apparatus in accordance with an exemplary embodiment. FIG. 2 illustrates a partial perspective view for explaining a plurality of panels and a router bit of the router apparatus in accordance with an exemplary embodiment. FIG. 3 is a partial enlarged perspective view showing a region A of FIG. 2.

Referring to FIG. 1, the router apparatus in accordance with this exemplary embodiment includes a plurality of panels 100, a router bit 200, a first supporting unit 310, and a second supporting unit 320.

Panels 110, 120 and 130 of the plurality of panels 100 are vertically stacked. Each of panels 110, 120 and 130 may be, e.g., an array printed circuit board. In this situation, the array printed circuit board may by formed by connecting a plurality of printed circuit boards into an array. For example, as shown in the drawing, a first panel 110 may be an array printed circuit board formed by connecting a plurality of printed circuit boards 111 and 112. Further, a second panel 120 and a third panel 130 may be an array printed circuit board formed by connecting a plurality of printed circuit boards 121 and 122 and an array printed circuit board formed by connecting a plurality of printed circuit boards 131 and 132, respectively.

A plurality of chips c may be arranged on a single printed circuit board, e.g., a first printed circuit board 111 of first panel 110. Also, a plurality of chips c may be arranged on each of printed circuit boards 112, 121, 122, 131 and 132. Although a plurality of chips c are arranged on an upper surface of each of printed circuit boards 111, 112, 121, 122, 131 and 132 in the drawing, a plurality of chips may or may also be arranged on a lower surface thereof. In this situation, arranging a plurality of chips may mean mounting a plurality of chips c on each of printed circuit boards 111, 112, 121, 122, 131 and 132 by, e.g., a surface mounting process.

Router bit 200 cuts panels 100 at the same time. One end of router bit 200 is connected to the first supporting unit 310 and the other end of router bit 200 is connected to second supporting unit 320. Router bit 200 may include one end 210, other end 230, and a cutter 220 formed between one end 210 and other end 230. Router bit 200 may rotate around an axis extending along one end 210, cutter 220 and other end 230. In other words, router bit 200 may cut the panels 100 at the same time by simultaneously passing through vertically stacked panels 100 while rotating at a high speed.

Specifically, router bit 200 moves in a first direction while rotating at a high speed to pass through panels 100. Accordingly, array printed circuit boards 110, 120 and 130 may be divided into the respective printed circuit boards. As described above, one router bit 200 passes through vertically stacked panels 100 at the same time, thereby cutting panels 100 through one routing process. As a result, it is possible to considerably improve an operating speed.

First supporting unit 310 is connected to one end 210 of router bit 200. Further, first supporting unit 310 may include a first fixing unit 350 for fixing one end of router bit 200. As shown in the drawing first supporting unit 310 may movably support router bit 200.

First fixing unit 350 is directly connected to one end of trouter bit 200, and router bit 200 may be rotatably fixed to first fixing unit 350. In other words, router bit 200 may rotate at a high speed around a rotation axis extending along one end 210, cutter 220 and other end 230 without varying a position on first fixing unit 350. That is, router bit 200 rotates at a high speed while being fixed to a certain position of a second fixing unit 330. Router bit 200 is moved as second fixing unit 330 itself moves along the second supporting unit 320, particularly, a guide rail 325.

Similarly, second supporting unit 320 is connected to the other end 230 of router bit 200. Further, second supporting unit 320 may include second fixing unit 330 to which the other end of router bit 200 is fixed. As shown in the drawing, second supporting unit 320 serves to movably support router bit 200 and is disposed to face first supporting unit 310 such that router bit 200 can be stably moved.

Second fixing unit 330 of second supporting unit 320 is directly connected to the other end of router bit 200 such that the router bit 200 can rotate while being fixed to the second fixing unit 330. Similar to first fixing unit 350, router bit 200 may rotate at a high speed around the rotation axis without varying a position on second fixing unit 330. In other words, router bit 200 rotates at a high speed while being fixed to a certain position of second fixing unit 330. Router bit 200 is moved as second fixing unit 330 itself moves along the second supporting unit 320, particularly, along guide rail 325.

Although not illustrated in the drawings, a driving unit for driving a rotation of router bit 200 may be installed in any one of first supporting unit 310 and second supporting unit 320. For example, in a situation where guide rail 325 is formed at second supporting unit 320 and second fixing unit 330 is a bearing, a rotation driving unit may be installed in the first supporting unit 310 to provide a rotational driving force to router bit 200.

More specifically, second supporting unit 320 includes guide rail 325 that guides movement of router bit 200. As described above, router bit 200 may move in a first direction. In this situation, guide rail 325 may guide router bit 200 so that router bit 200 can stably move in a specific direction. As shown in the drawing, guide rail 325 may be formed such that router bit 200 can move, e.g., in a linear direction.

Guide rail 325 may include a groove 327 formed in second supporting unit 320 in order to extend in a moving direction of router bit 200. Groove 327 may be formed in second supporting unit 320 as a stepped portion, and connected to the other end of router bit 200. Specifically, the other end of router bit 200 may be coupled with second fixing unit (bearing) 330 provided in groove 327. That is, second supporting unit 320 may include bearing 330 provided in groove 327 and bearing 330 may be coupled with the other end of router bit 200 in order to support the rotation of router bit 200.

As described above, first supporting unit 310 may include first fixing unit 350 to which one end of router bit 200 is fixed, and second supporting unit 320 may include second fixing unit 330 to which the other end of router bit 200 is fixed. In this situation, second fixing unit 330 may include bearing 330, which supports the rotation of router bit 200.

The other end 230 of router bit 200 may include a first fastening unit having a polygonal shape, and bearing 330 may include a second fastening unit 335 having a polygonal shape corresponding to the first fastening unit. As illustrated in FIG. 3, the other end 230 of router bit 200 may be formed as the first fastening unit having, e.g., a hexagonal shape. A hexagonal insertion portion corresponding to the first fastening unit having a hexagonal shape may be formed as second fastening unit 335 in bearing 330. Accordingly, the other end 230 of router bit 200 may be coupled with second fixing unit 330, and bearing 330 may support the rotation of router bit 200.

Further, as shown in FIG. 3, bearing 330 may guide the movement of router bit 200 while moving along groove 327 formed in guide rail 325. In this situation, as shown in FIG. 2, first fixing unit 350 of first supporting unit 310 and second fixing unit 330 of second supporting unit 320 may be provided at opposite sides of router bit 200, so that router bit 200 can stably move along first supporting unit 310 and second supporting unit 320.

In this situation, stably moving router bit 200 may mean moving router bit 200 in a desired direction. For example, in response to router bit 200 being intended for vertically passing through panels 100, it may mean moving first fixing unit 350 and second fixing unit 330 while maintaining balance, so that router bit 200 can move vertically with respect to panels 100.

In short, the router bit 200 may cut the panels 100 at the same time by passing through vertically stacked panels 100, while rotating at a high speed. In this situation, any one of first and second supporting units 310 and 320 connected to the opposite sides of router bit 200 may be formed to have guide rail 325 for guiding movement of router bit 200. Guide rail 325 may include groove 327 formed along the moving direction of router bit 200, and bearing 330 may be provided in groove 327. Further, bearing 330 may be connected to router bit 200 in order to support router bit 200 such that router bit 200 can stably move during the rotation.

As described above, in accordance with in exemplary embodiment the router bit simultaneously cuts a plurality of panels stacked vertically, thereby further improving productivity. Further, the router bit is fixed at opposite sides, and the guide rail is formed such that the router bit can stably move therein, thereby improving cutting accuracy.

Figure 4:
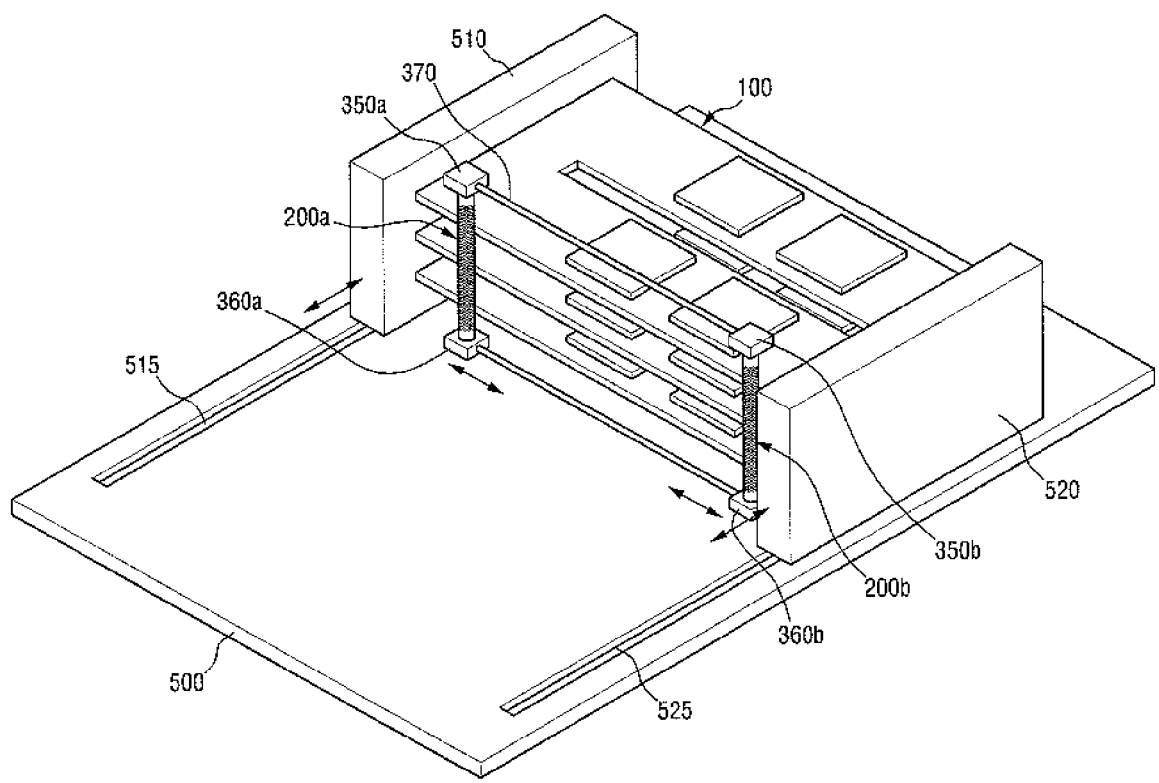
FIG. 4 shows a perspective view of a router apparatus in accordance with another exemplary embodiment.

Hereinafter, a router apparatus in accordance with another exemplary embodiment will be described with reference to FIG. 4. FIG. 4 shows a perspective view of a router apparatus in accordance with another embodiment of the present invention.

The router apparatus in accordance with another exemplary embodiment is different from the router apparatus of the above-described embodiment in that first and second frames supporting a plurality of panels at opposite sides thereof move in a specific direction in order to allow a router bit to pass through the panels. For convenience of explanation, a repeated description of substantially the same components as those of the above-described exemplary embodiment is omitted or simplified.

As shown in FIG. 4, the router apparatus in accordance with another exemplary embodiment includes a plurality of panels 100, a first frame 510, a second frame 520, a body 500, and router bits 200a and 200b.

First frame 510 and the second frame 520 are arranged on body 500 in order to support panels 100 at opposite sides. In this situation, first frame 510 and second frame 520 move in a first direction, and muter bits 200a and 200b pass through the panels 100 to cut panels 100 at the same time. As shown in the drawing, first frame 510 and second frame 520 may be arranged to face each other in order to fix panels 100 at opposite sides.

In other words, panels 100 are fixed to first frame 510 and second frame 520, and first frame 510 and second frame 520 move in a specific direction on body 500 so that panels 100 can move in the specific direction. Accordingly, panels 100 pass through router bits 200a and 200b rotating at a high speed at certain positions, so that panels 100 can be cut at the same time by router bits 200a and 200b.

Body 500 may include a first guide rail 515 and a second guide rail 525. Specifically, first frame 510 may be coupled with first guide rail 515 in order to move in the first direction along first guide rail 515, and second frame 520 may be coupled with second guide rail 525 to move in the first direction along second guide rail 525. As described above, since first frame 510 and second frame 520 vertically stacked panels 100 at opposite sides, first frame 510 and second frame 520 may move together while facing each other. For example, first frame 510 and second frame 520 may move at the same speed.

A first fixing unit 350a may be connected to one end of router bit 200a, and a second fixing unit 360a may be connected to the other end of router bit 200a. In this situation, any one of first fixing unit 350a and second fixing unit 360a may be installed on body 500. For example, as shown in the drawing, in a situation where router bit 200a is disposed vertically with respect to body 500 and panels 100, second fixing unit 360a may be installed on body 500. In other words, second fixing unit 360a may be installed on body 500 and the other end of router bit 200a may be connected to second fixing unit 360a such that router bit 200a is vertically installed on body 500. Further, one end of router bit 200a may be connected to first fixing unit 350a. Accordingly, first fixing unit 350a and second fixing unit 360a may be arranged above and below panels 100, respectively, and router bit 200a may pass through panels 100 as panels 100 move.

As described above, a cutter may be formed between one end and the other end of router bit 200a, and router bit 200a may rotate around a rotation axis extending along one end, the cutter and the other end of router bit 200a. Namely, router bit 200a rotating at a high speed may pass through panels 100 to cut panels 100.

As shown in FIG. 4, router bits 200a and 200b may include two or more router bits. For example, first and second muter bits 200a and 200b may be separated from each other by a first distance. The first distance may be changed by moving at least one of first and second router bits 200a and 200b.

Specifically, in the manner way as first router bit 200a, a third fixing unit 350b and a fourth fixing unit 360b may be respectively connected to one end and the other end of second router bit 200b. Further, any one of third fixing unit 350b and fourth fixing unit 360b may be installed on body 500. Since a connection relationship between second router bit 200b and third and fourth fixing units 350b and 360b is substantially equal to a connection relationship between router bit 200a and first and second fixing units 350a and 360a, a detailed description thereof is omitted.

Further, a distance between first router bit 200a and second router bit 200b may be adjusted by a distance adjusting unit 370. Specifically, first fixing unit 350a of first router bit 200a may be connected to third fixing unit 350b of the second router bit 200b by distance adjusting unit 370. Also, second fixing unit 360a of first router bit 200a may be connected to fourth fixing unit 360b of second muter bit 200b by distance adjusting unit 370. Further, the distance between first router bit 200a and second router bit 200b may be adjusted by extension or contraction of distance adjusting unit 370.

In this situation, the movement of first router bit 200a and second muter bit 200b may be selectively performed. For example, before the movement of panels 100 is started, or after the movement of panels 100 has been completed, i.e., in a state where the movement of panels 100 is stopped, the distance between first router bit 200a and second router bit 200b may be adjusted. In some other exemplary embodiments, first router bit 200a and second router bit 200b may move during the movement of panels 100. It may be selectively performed according to purposes of a cutting process.

For example, a distance from first router bit 200a to second router bit 200b may be adjusted by increasing or reducing a length of distance adjusting unit 370 at a connection portion between first fixing unit 350a and first router bit 200a and a connection portion between second fixing unit 360a and first router bit 200a. Similarly, a distance from second router bit 200b to first router bit 200a may be adjusted by increasing or reducing a length of distance adjusting unit 370 at a connection portion between third fixing unit 350b, second router bit 200b and a connection portion between fourth fixing unit 360b and second router bit 200b. Further, the length of distance adjusting unit 370 may be adjusted at each of first router bit 200a and second router bit 200b. In this situation, the length of distance adjusting unit 370 may be adjusted such that first router bit 200a and second router bit 200b can stably move while first router bit 200a and second router bit 200b are parallel to each other, and perpendicular to body 500 and panels 100.

As described above, in the router apparatus in accordance with another exemplary embodiment, the first and second frames to which a plurality of panels are fixed are moved on the body, so that the router bits can pass through the panels. Accordingly, since the router bits can cut the panels at the same time, it is possible to improve productivity. Further, since the panels are moved by the movement of the first and second frames, the panels can be cut by the router bits rotating at a high speed while being fixed to certain positions. In other words, since the panels can be cut by the movement of the first and second frames without the movement of the router bits, it is possible to perform a cutting process in a state where the router bits are stably installed. Accordingly, since an arrangement state of the router bits is not changed during the cutting process, there is an advantage of improving cutting accuracy.

Figure 5:
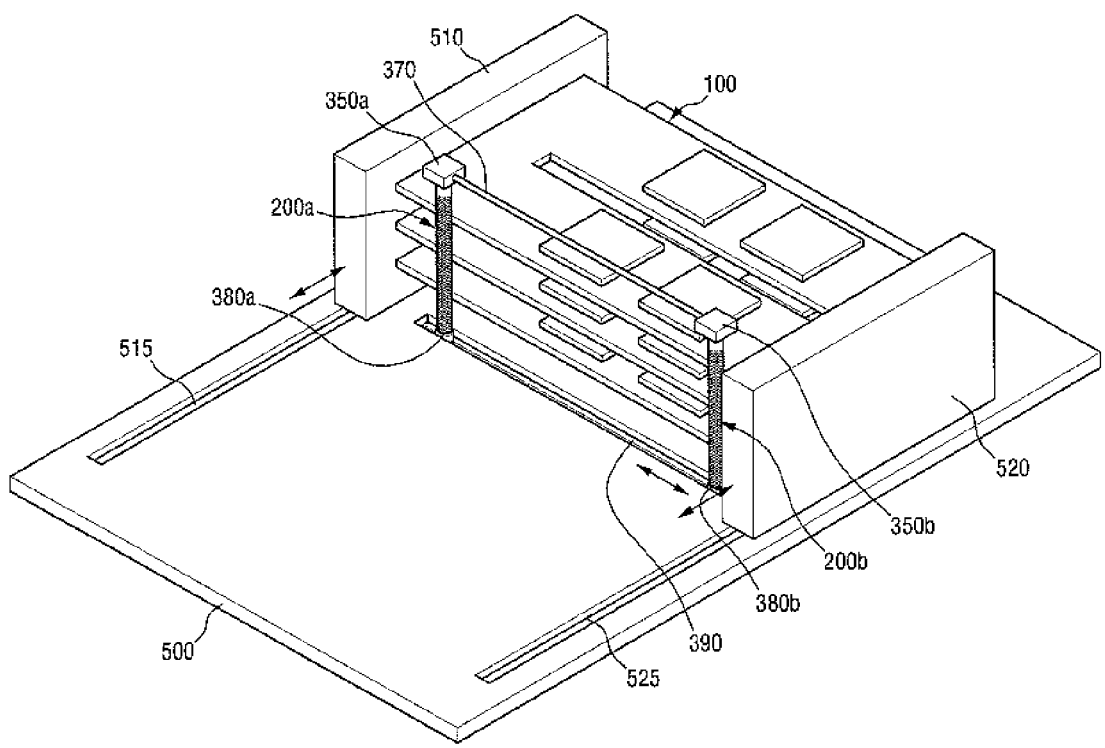
FIG. 5 shows a perspective view of a router apparatus in accordance with still another exemplary embodiment.

Hereinafter, a router apparatus in accordance with still another exemplary embodiment will be described with reference to FIG. 5. FIG. 5 shows a perspective view of a router apparatus in accordance with still another exemplary embodiment.

The router apparatus in accordance with still another exemplary embodiment is different from the router apparatuses of the above-described exemplary embodiments in that a groove is formed in a body such that router bits move therein. For convenience of explanation, a repeated description of substantially the same components as those of the above-described exemplary embodiments is omitted or simplified.

As shown in FIG. 5, the router apparatus in accordance with still another exemplary embodiment includes a plurality of panels 100, a first frame 510, a second frame 520, a body 500, and router bits 200a and 200b.

Panels 100 are fixedly connected to first frame 510 and second frame 520 to move in a first direction along the movement of first frame 510 and second frame 520. In this situation, router bits 200a and 200b may move in a second direction different from the first direction. A third groove 390 may be formed in body 500 to extend in the second direction. As shown in FIG. 5, bearings may be provided in the third groove 390 to support the high speed rotation of router bits 200a and 200b and the bearings may be coupled with router bits 200a and 200b.

As shown in the drawing, two or more router bits 200a and 200b, e.g., first router bit 200a and second router bit 200b, may be arranged on body 500. Although first router bit 200a and second router bit 200b are coupled with the bearings respectively in the drawing, in some other exemplary embodiments, only one of first router bit 200a and second router bit 200b may be coupled with the bearing in order to move along third groove 390. One end of first router bit 200a may be connected to one end of second router bit 200b by distance adjusting unit 370, so that a distance between first router bit 200a and second router bit 200b can be adjusted.

In short, the router apparatus in accordance with still another exemplary embodiment includes the groove and the bearing so that first router bit 200a and second router bit 200b can move quickly and stably, thereby improving cutting accuracy. Further, there is an advantage of improving productivity by simultaneously cutting a plurality of panels stacked vertically.

While the present inventive concept has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A router apparatus comprising:
a plurality of vertically stacked panels;
a router bit which simultaneously cuts the panels;
a first supporting unit connected to one end of the router bit;
a second supporting unit connected to the other end of the router bit, and a guide rail is formed in the second supporting unit to guide a movement of the router bit moving along the guide rail,
wherein the router bit moves in a first direction, and the guide rail includes a groove which is formed in the second supporting unit and extends in the first direction, and
wherein the second supporting unit includes a bearing which is provided in the groove and coupled with the other end of the router bit in order to support the router bit during a rotation of the router bit.

2. A router apparatus comprising:
a plurality of vertically stacked panels;
a router bit which simultaneously cuts the panels;
a first supporting unit connected to one end of the router bit;
a second supporting unit connected to the other end of the router bit, and a guide rail is formed in the second supporting unit to guide a movement of the router bit moving along the guide rail,
wherein the second supporting unit includes a bearing which is provided on the guide rail and coupled with the other end of the router bit in order to support the router bit during a rotation of the router bit.

3. A router apparatus comprising:
a plurality of vertically stacked panels;
first and second frames which support the panels at opposite sides;
a body on which the first and second frames are arranged; and
a router bit disposed on the body to simultaneously cut the vertically stacked panels,
wherein the first and second frames move in a first direction, and the router bit passes through the panels to simultaneously cut the panels, and
wherein the first frame has a vertically extending side and the second frame has a vertically extending side, and the vertically extending side of the first frame and the vertically extending side of the second frame support the plurality of stacked panels at opposite sides.

4. The router apparatus of claim 3, further comprising first and second fixing units respectively connected to one end and the other end of the router bit, wherein one of the first and second fixing units is installed on the body.

5. The router apparatus of claim 3, wherein the body includes a first guide rail and a second guide rail,
the first frame is coupled with the first guide rail to move in the first direction along the first guide rail, and the second frame is coupled with the second guide rail to move in the first direction along the second guide rail.

6. The router apparatus of claim 3, wherein the router bit includes a cutter formed between the one end and the other end and rotates around an axis extending along the one end, the cutter and the other end.

7. The router apparatus of claim 3, further comprising another router bit.

8. The router apparatus of claim 7, wherein the router bit and the other router bit are separated from each other by a first distance, and
at least one of the first and second router bits moves to change the first distance.

9. The router apparatus of claim 3, wherein the router bit moves in a second direction, and
a groove is formed in the body to extend in the second direction.

10. The router apparatus of claim 9, wherein the body includes a bearing which is provided in the groove and is coupled with the other end of the router bit to support the router bit during a rotation of the router bit.

11. The router apparatus of claim 3, wherein the router bit simultaneously passes through the vertically stacked panels while rotating at a speed to simultaneously cut the panels.

* * * * *